(12) United States Patent
Interrante et al.

(10) Patent No.: US 9,224,712 B2
(45) Date of Patent: Dec. 29, 2015

(54) 3D BOND AND ASSEMBLY PROCESS FOR SEVERELY BOWED INTERPOSER DIE

(71) Applicant: International Business Machines Corporation, Armonk, NY (US)

(72) Inventors: Marcus E. Interrante, New Paltz, NY (US); Mario J. Interrante, New Paltz, NY (US); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/177,348

(22) Filed: Feb. 11, 2014

(65) Prior Publication Data

US 2015/0228614 A1 Aug. 13, 2015

(51) Int. Cl.
*H01L 21/30* (2006.01)
*H01L 23/00* (2006.01)
(Continued)

(52) U.S. Cl.
CPC .............. *H01L 24/81* (2013.01); *B23K 3/0623* (2013.01); *H01L 21/563* (2013.01); *H01L 21/6835* (2013.01); *H01L 23/49822* (2013.01); *H01L 23/49827* (2013.01); *H01L 24/17* (2013.01); *H01L 25/0657* (2013.01); *H01L 25/50* (2013.01); *H01L 2221/68372* (2013.01); *H01L 2224/16057* (2013.01); *H01L 2224/16238* (2013.01); *H01L 2224/8109* (2013.01); *H01L 2224/8121* (2013.01); *H01L 2224/81815* (2013.01); *H01L 2225/06513* (2013.01); *H01L 2225/06517* (2013.01); *H01L 2924/1427* (2013.01); *H01L 2924/1431* (2013.01); *H01L 2924/1434* (2013.01); *H01L 2924/2064* (2013.01); *H01L 2924/2065* (2013.01); *H01L 2924/20106* (2013.01); *H01L 2924/20107* (2013.01); *H01L 2924/20645* (2013.01);
(Continued)

(58) Field of Classification Search
USPC .......................... 438/612–617, 118, 455, 457; 257/E23.021, E23.069, E21.503, 257/E21.511
See application file for complete search history.

(56) References Cited

U.S. PATENT DOCUMENTS 7,135,124 B2   11/2006   Krywanczyk et al.
7,722,446 B2    5/2010   Krywanczyk et al.
(Continued)

FOREIGN PATENT DOCUMENTS

JP   2-239621   9/1990
JP   2000169265  6/2000
(Continued)

*Primary Examiner* — Jasmine Clark
(74) *Attorney, Agent, or Firm* — Scully, Scott, Murphy & Presser, P.C.; Steven J. Meyers, Esq.

(57) ABSTRACT

An interposer structure containing a first set of solder balls is placed in proximity to a vacuum distribution plate which has a planar contact surface and a plurality of openings located therein. A vacuum is then applied through the openings within the vacuum distribution plate such that the first set of solder balls are suspended within the plurality of openings and the interposer structure conforms to the planar contact surface of the vacuum distribution plate. A semiconductor chip containing a second set of solder balls is tacked to a surface of the interposer structure. A substrate is then brought into contact with a surface of the interposer structure containing the first set of solder balls, and then a solder reflow and underfill processes can be performed. Warping of the interposer structure is substantially eliminated using the vacuum distribution plate mentioned above.

19 Claims, 5 Drawing Sheets

(51) Int. Cl.
  *H01L 21/56* (2006.01)
  *H01L 23/498* (2006.01)
  *H01L 25/00* (2006.01)
  *H01L 25/065* (2006.01)
  *H01L 21/683* (2006.01)
  *B23K 3/06* (2006.01)
(52) U.S. Cl.
  CPC .......... *H01L2924/20646* (2013.01); *H01L 2924/20647* (2013.01); *H01L 2924/20648* (2013.01); *H01L 2924/20649* (2013.01); *H01L 2924/20651* (2013.01)

(56) References Cited

U.S. PATENT DOCUMENTS

2005/0106879 A1   5/2005   Krywanczyk et al.
2008/0142969 A1*  6/2008   Hakuno .................. 257/738

FOREIGN PATENT DOCUMENTS

| JP | 2004-47670 | 2/2004 |
| WO | 03107430 | 12/2003 |
| WO | 2007137969 | 12/2007 |

* cited by examiner

3D BOND AND ASSEMBLY PROCESS FOR SEVERELY BOWED INTERPOSER DIE

BACKGROUND

The present application relates to three dimensional (3D) vertical integration of semiconductor devices, and more particularly to a bonding method for forming 3D stacked assemblies and a vacuum distribution plate that can be used in such a bonding method.

One type of 3D integrated circuit can include two or more layers of active electronic components stacked vertically and electrically joined with through-substrate vias and solder bumps. The 3D stacked assemblies can provide numerous benefits such as increased package density yielding smaller interconnect footprints between the semiconductor devices, and improved bandwidth due to the short connection lengths made possible by the use of through-substrate vias. The 3D stacked assemblies described above may be fabricated in any number of known methods. Some 3D stacked assemblies can include one or more silicon interposers which can be used to re-direct circuitry between a chip carrier and one or more top chips.

Warping of the components of the 3D integrated semiconductor devices during typical assembly processes can result in failed solder bump connections and short circuits. The influence warping has on 3D chip packaging can become more significant as the chip size increases and the component thickness decreases.

Accordingly, there exists a need in the art to overcome the deficiencies and limitations described hereinabove.

SUMMARY

An interposer structure containing a first set of solder balls is placed in proximity to a vacuum distribution plate which has a planar contact surface and a plurality of openings located therein. A vacuum is then applied through the openings within the vacuum distribution plate such that the first set of solder balls are suspended within the plurality of openings and the interposer structure conforms to the planar contact surface of the vacuum distribution plate. A semiconductor chip containing a second set of solder balls is tacked to a surface of the interposer structure. A substrate is then brought into contact with a surface of the interposer structure containing the first set of solder balls, and then solder reflow and underfill processes can be performed. Warping of the interposer structure is substantially eliminated using the vacuum distribution plate mentioned above.

In one aspect of the present application, a bonding method that can be used for 3D chip stacking assembly is provided. The bonding method of the present application includes inserting an interposer structure into a vacuum distribution plate which has a planar contact surface. A vacuum is then applied to a first assembly of the interposer structure and the vacuum distribution plate. In accordance with the present application, the vacuum applies a force to the interposer structure so that the interposer structure conforms to the planar contact surface of the vacuum distribution plate. Conforming the interposer structure to the planar contact surface of the vacuum distribution plate removes a curvature from the interposer structure. Next, a semiconductor chip is tacked to a surface of the interposer structure that is opposite a surface of the interposer structure that is in contact with the planar contact surface of the vacuum distribution plate. A second assembly of the interposer structure and the semiconductor chip is then contacted to a substrate. Next, a furnace reflow process is applied to the second assembly to bond the second assembly to the substrate.

In another aspect of the present application, a vacuum distribution plate for use in chip bonding methods is provided. The vacuum distribution plate of the present application includes a material having a plurality of openings extending entirely through the material. The plurality of openings within the material are for housing a set of solder balls of an interposer structure and for applying a vacuum to the interposer structure. The spacing between the plurality of openings in the material is selected to correspond to spacing separating adjacent solder balls in the set of solder balls.

DETAILED DESCRIPTION

Figure 1:
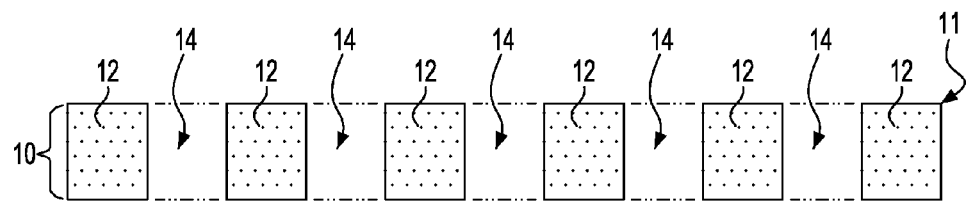
FIG. 1 is a cross sectional view of a vacuum distribution plate in accordance with an exemplary embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Three-dimensional (3D) integrated semiconductor assemblies using through-semiconductor-vias and solder bumps provide benefits such as increasing both packaging density and bandwidth due to short interconnection lengths. Interposer structure warpage during reflow processes may result in non-wetting of the solder bumps and/or bridging between solder joints, thereby decreasing the assembly yield. This influence has become more significant when the chip size increases and the interposer structure thickness decreases. The present application provides a 3D bonding method in which warping of the interposer structure and thus the final 3D integration semiconductor assembly is significantly reduced as compared to prior art bonding methods.

In the present application, a vacuum distribution plate 10 such as shown in FIG. 1 is used to mitigate the warping during 3D assembly. The vacuum distribution plate 10 that is employed in the present application has a planar contact surface 11 and a plurality of openings 14 which extend entirely through a material 12 having a first coefficient of thermal expansion (CTE). As is known to those skilled in that art, thermal expansion is the tendency of a material to change volume in response to a change in temperature. The degree of expansion divided by the change in temperature is referred to a materials "coefficient of thermal expansion".

In one embodiment of the present application, material 12 of the vacuum distribution plate 10 may comprise a semiconductor material such as, for example, silicon (Si), germanium (Ge), a silicon germanium (SiGe) alloy, a silicon carbide (SiC) alloy, a silicon germanium carbide (SiGeC) alloy, or an III/V compound semiconductor (e.g., InAs, GaAs or InP). Of the various semiconductor materials and in one embodiment of the present application, material 12 of vacuum distribution plate 10 may comprise silicon.

In another embodiment of the present application, material 12 of the vacuum distribution plate 10 may comprise a dielectric material such as, for example, undoped glass or doped glass. In yet another embodiment of the present application, material 12 of the vacuum distribution plate 10 may comprise a metal such as, for example, titanium (Ti), vanadium (V), chromium (Cr), manganese (Mn), iron (Fe), cobalt (Co), nickel (Ni), copper (Cu), molybdenum (Mo) and alloys thereof.

In one embodiment of the present application, the material 12 that provides the vacuum distribution plate 10 of the present application may have a thickness from 10 microns (i.e., µm) to 400 µm. Other thickness that are greater than or lesser than the thickness ranges mentioned above can also be used as the thickness of the material 12 that provides the vacuum distribution plate 10 of the present application if the solder ball array geometry and solder ball size so dictate.

The vacuum distribution plate 10 shown in FIG. 1 can be formed by first providing a contiguous layer of material 12. The contiguous layer of material 12 can then be patterned to include the plurality of openings 14 which extend from a planar contact surface 11 to another planar surface that is opposite the planar contact surface 11. In one example, the patterning of the contiguous layer of material 12 may be performed by lithography and etching. Lithography includes forming a photoresist material (not shown) on a surface of the contiguous layer of material 12, exposing the photoresist material to a desired pattern of radiation and then developing the photoresist material. Once developed, a pattern is provided to the photoresist material which can be transferred to the underlying contiguous layer of material 12 by etching. Etching may comprise a dry etch process (i.e., reactive ion etching, plasma etching, or ion beam etching) or a chemical wet etch process. Following the transfer of the pattern into the contiguous layer of material 12, the vacuum distribution plate 10 shown in FIG. 1 is provided. The patterned photoresist material is removed after patterned transfer by a resist stripping process such as, for example, ashing. The contiguous layer of material 12 can be patterned utilizing other patterning techniques which are well known to those skilled in the art.

Each opening 14 that is formed into the contiguous layer of material 12 has a width that can accommodate a solder ball of an interposer structure which will be subsequently inserted into the vacuum distribution plate 10. In one embodiment, each opening 14 that is formed into the contiguous layer of material 12 has a diameter, i.e., width, from 25 µm to 250 µm. In another embodiment of the present application, each opening 14 that is formed into the contiguous layer of material 12 has a diameter, i.e., width, from 10 µm to 25 µm. Other diameters, i.e., widths, that are greater than or lesser than the ranges provided above can also be used so long as the selected diameter, i.e., width, can accommodate a solder ball of an interposer structure, without having the solder ball completely plug up each opening 14 that is present in the vacuum distribution plate 10.

Each opening 14 that is formed into the contiguous layer of materials 12 provides a series of openings 14 in the vacuum distribution plate 10 which is separated by a distance that corresponds to a distance separate adjacent solder balls of an interposer structure which will be subsequently inserted into the vacuum distribution plate 10. In one embodiment, the distance between each opening 14 is from 15 µm to 100 µm. In another embodiment of the present application, the distance between each opening 14 is from 100 µm to 400 µm. Other distances that are greater than or lesser than the distance ranges provided above can also be used so long as the selected distance can accommodate a solder ball of an interposer structure, without having the solder ball contact the planar contact surface 11 of the vacuum distribution plate 10.

Figure 2:
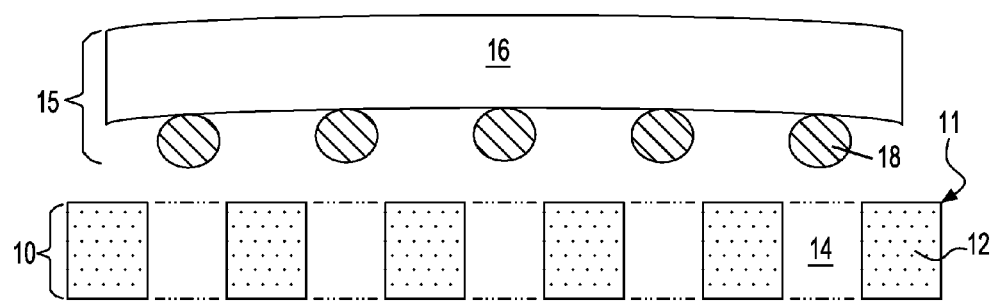
FIG. 2 is a cross sectional view of an interposer structure positioned in proximity to a planar contact surface of the vacuum distribution plate shown in FIG. 1.

Referring now to FIG. 2, there is illustrated an interposer structure 15 positioned in proximity to the planar contact surface 11 of the vacuum distribution plate 10 shown in FIG. 1. The interposer structure 15 includes a first set of solder balls 18 that are attached to metal bond pads (not shown) that are formed on a material surface of interposer component 16. The first set of solder balls 18 are lead-free solder balls which are well known to those skilled in the art. The first set of solder balls 18 can also be referred to herein as a first set of C4 solder balls. In some embodiments, each solder ball 18 can be replaced with a solder interconnect containing metal pillar or a post structure.

The interposer component 16 of the interposer structure 15 that is employed in the present application has a second coefficient of thermal expansion which substantially equals the first coefficient of thermal expansion of material 12 of the vacuum distribution plate 10. By "substantially equals" it is meant that the second coefficient of thermal expansion of interposer component 16 is the same or within ±5% from the first coefficient of thermal expansion of material 12 of the vacuum distribution plate 10.

The interposer structure 15, namely, interposer component 16, which is employed in the present application, has a curvature associated therewith. In one embodiment of the present application, the curvature of the interposer structure 15 may range from 500 μm to 1.5 mm. In another embodiment of the present application, the curvature of the interposer structure 15 may range from 200 μm to 500 μm. In one embodiment of the present application, the interposer structure 15 that can be used in the present application has a thickness from 30 μm to 50 μm.

In one embodiment of the present application, the interposer component 16 of the interposer structure 15 may include a semiconductor base material, semiconductor device circuitry, interconnect circuitry, metal bond pads, and through-substrate vias. The semiconductor base material may comprise one of the semiconductor materials mentioned above for the semiconductor material that can provide the contiguous layer of material 12 that can be used in forming the vacuum distribution plate 10. In one example, the semiconductor base material of the interposer component 16 may comprise silicon.

The interconnect circuitry that can be present in the interposer component 16 may include one or more layers of inter-level dielectric materials which include a plurality of conductive structures embedded therein. The conductive structures may include copper, aluminum or alloys thereof. The interconnect circuitry can be formed utilizing well known back-end-of-the-line (BEOL) technology. The metal bond pads and through-substrate vias of the interposer component 16 can be provided utilizing techniques and materials that are also well known to those skilled in the art.

In another embodiment, the interposer component 16 may contain only interconnect circuitry which includes metal bond pads that are formed on an exposed surface of an inter-level material. In another embodiment, the interposer component 16 may contain only a through-substrate via structure which includes terminal metal bond pads.

The interposer component 16 of interposer structure 15 may include one or more active and/or passive semiconductor devices (not specifically shown) thereon. For example, the interposer component 16 of interposer structure 15 may include logic devices, memory devices, devices for voltage regulation or any combination thereof. The one or more active and/or passive semiconductor devices can be provided utilizing techniques and materials that are well known to those skilled in the art. Typically, the one or more active and/or passive semiconductor devices are formed upon and within a semiconductor base material.

Figure 3:
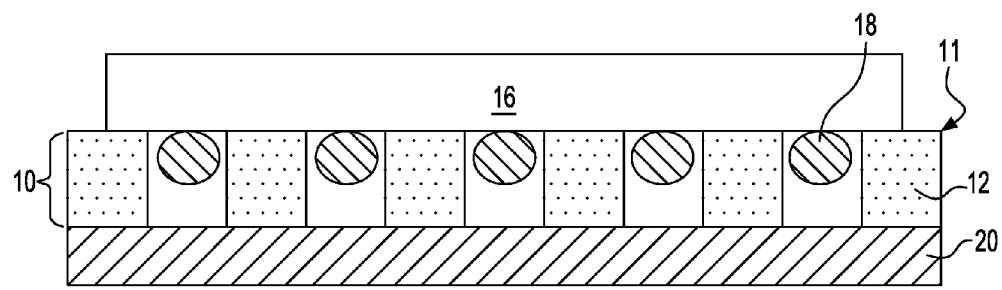
FIG. 3 is a cross sectional view of the structure illustrated in FIG. 2 after inserting the interposer structure into the vacuum distribution plate and applying a vacuum to a first assembly of the interposer structure and the vacuum distribution plate.

Referring now to FIG. 3, there is illustrated the structure of FIG. 2 after inserting the interposer structure 15 into the vacuum distribution plate 10 and applying a vacuum to a first assembly of the interposer structure 15 and the vacuum distribution plate 10. The inserting of the interposer structure 15 into the vacuum distribution plate 10 includes positioning the first set of solder balls 18 (or solder interconnect containing metal pillars or post structures) of the interposer structure 15 into the openings 14 of the vacuum distribution plate 10. The positioning of the first set of solder balls 18 (or solder interconnect containing metal pillars or post structures) of the interposer structure 15 may be performed by hand or by mechanical means such as, for example, a robot arm.

In one embodiment of the present application, the positioning of the first set of solder balls 18 of the interposer structure 15 into the openings 14 of the vacuum distribution plate 10 may occur outside a chamber that includes a vacuum source 20, and then after the positioning, the structure is placed within a chamber that includes a vacuum source 20. In another embodiment, the positioning of the first set of solder balls 18 (or solder interconnect containing metal pillars or post structures) of the interposer structure 15 into the openings 14 of the vacuum distribution plate 10 occurs within a chamber that includes a vacuum source 20.

Once the first set of solder balls 18 (or solder interconnect containing metal pillars or post structures) are positioned in the openings 14 that are present in the vacuum distribution plate 10, a vacuum is applied from the bottom of the vacuum distribution plate 10 and through each opening 14 present in the vacuum distribution plate by a vacuum source 20. Vacuum source 20 may be a vacuum pump or any other apparatus which can apply a vacuum to a structure.

In accordance with the present application, the vacuum applies a force to the interposer structure 15 so that the interposer structure 15 is conformed to the planar contact surface 11 of the vacuum distribution plate 10. The conforming of the interposer structure 15 to the planar contact surface 11 of the vacuum distribution plate 10 removes a curvature from the interposer structure 15 providing a first assembly of a planar interposer structure 15 and the vacuum distribution plate 10.

In one embodiment of the present application, the applying the vacuum comprises pulling the vacuum through each opening 14 in the vacuum distribution plate 10 so that a gauge attached to the vacuum source 20 has a gauge pressure reading of from −60 kPa to −90 kPa. In another embodiment of the present application, the applying the vacuum comprises pulling the vacuum through each opening 14 in the vacuum distribution plate 10 so that a gauge attached to the vacuum source 20 has a gauge pressure reading of from −30 kPa to −60 kPa.

After applying the vacuum and in some embodiments of the present application, a solder flux (or "flux") can be applied to the surface of the interposer structure 15 that is opposite the surface containing the first set of solder balls 18 (or solder interconnect containing metal pillars or post structures). The solder flux is a chemical that removes surface oxides from metallic surfaces to facilitate subsequent solder bonding. Solder flux can be applied at room temperature. As used herein "room temperature" denotes a temperature from 20° C. to 30° C.

Figure 4:
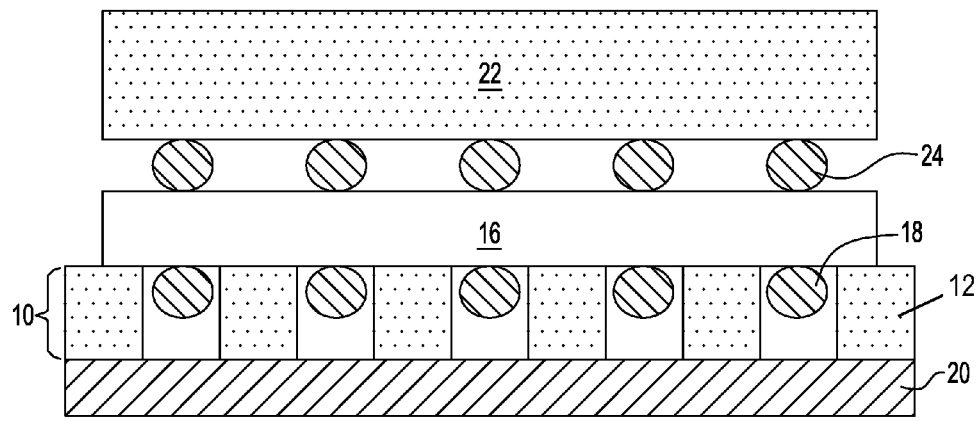
FIG. 4 is a cross sectional view of the structure illustrated in FIG. 3 after tacking a semiconductor chip having a surface containing a second set of solder balls to a surface of the interposer structure that is opposite a surface of the interposer structure that is in contact with the planar contact surface of the vacuum distribution plate.

Referring now to FIG. 4, there is illustrated the structure of FIG. 3 after tacking a semiconductor chip 22 having a surface containing a second set of solder balls 24 to a surface of the interposer structure 15 that is opposite a surface of the interposer structure 15 that is in contact with the planar contact surface 11 of the vacuum distribution plate 10. In some embodiments, each solder ball 24 can be replaced with a solder interconnect containing metal pillar or a post structures. Tacking temporarily joins the semiconductor chip 22 to the interposer structure 15 using the second set of solder balls 24 (or solder interconnect containing metal pillars or post structures). Notably, tacking creates a solid state diffusion bond between the solder ball (or solder interconnect containing metal pillars or post structures) and its respective terminal metal bond pad by applying a pressure and a temperature for a specific time interval. This step of the present application provides a second assembly that includes the interposer structure 15 and the semiconductor chip 22.

Tacking includes positioning the semiconductor chip 22 including the second set of solder balls 24 (or solder interconnect containing metal pillars or post structures) above the first assembly of the interposer structure 15 and the vacuum distribution plate 10 and bringing the second set of solder balls 24 (or solder interconnect containing metal pillars or post structures) that are positioned on a surface of semiconductor 22 into contact with the respective terminal metal bond pads that are present on a surface of the interposer structure 15. The positioning and contacting may be performed by hand or by mechanical means. In the present application, tacking is performed while maintaining a vacuum on the first assembly of the interposer structure 15 and the vacuum distribution plate 10.

After contacting, a pressure can be applied to the second assembly of the semiconductor chip 22 and the interposer structure 15. The pressure can be applied by utilizing a weighted force as described herein below. Next, a thermal anneal is performed at a temperature that is below the actual reflow temperature of a solder ball alloy. In one embodiment, the thermal anneal is performed at a temperature from 200° C. to 215° C. The thermal anneal used during tacking creates a solid state diffusion bond between the second set of solder balls 24 (or solder interconnect containing metal pillars or post structures) and their respective terminal metal bond pads that are present on a surface of the interposer structure 15 which is opposite the surface of the interposer structure containing the first set of solder balls 18 (or solder interconnect containing metal pillars or post structures).

In some embodiments, the thermal anneal, i.e., heating, used during tacking may be performed in an inert ambient such as, for example helium, argon, neon or a mixture thereof. In other embodiments of the present application, the thermal anneal used during tacking may be performed in an atmosphere of nitrogen.

After tacking the semiconductor chip 22 to the surface of the interposer structure 15, the interposer structure 15, namely the interposer component 16, is substantially planar. By "substantially planar" it is meant the interposer structure 15 has less than 0.05% curvature. In some embodiment, the interposer structure 15 lacks any curvature after tacking.

The second set of solder balls (i.e., a set second of C4 solder balls) 24 are composed of lead free solder balls and are formed on metal bond pads (not specifically shown) that are formed on an exposed surface of the semiconductor chip 22. Semiconductor chip 22 can be formed utilizing techniques well known to those skilled in the art. Semiconductor chip 22 may be the same length or a lesser length than the interposer structure 15. Semiconductor chip 22 may include a semiconductor base material, interconnect circuitry, metal bond pads, and through-substrate vias. The semiconductor base material of the semiconductor chip 22 may comprise one of the semiconductor materials mentioned above for the semiconductor material that can provide the contiguous layer of material 12 that can be used in forming the vacuum distribution plate 10. In one example, the semiconductor base material of the semiconductor chip 22 may comprise silicon.

The interconnect circuitry of the semiconductor chip 22 may include one or more layers of interlevel dielectric materials which include a plurality of conductive structures embedded therein. The conductive structures may include copper, aluminum or alloys thereof. The interconnect circuitry can be formed utilizing well known BEOL technology. The metal bond pads and through-substrate vias can be provided utilizing techniques and materials that are also well known to those skilled in the art.

The semiconductor chip 22, particularly the semiconductor base material, may include one or more active and/or passive semiconductor devices (not specifically shown) thereon. For example, the semiconductor chip 22 may include logic devices, memory devices, devices for voltage regulation or any combination thereof. The one or more active and/or passive semiconductor devices can be provided utilizing techniques and materials that are well known to those skilled in the art.

Figure 5:
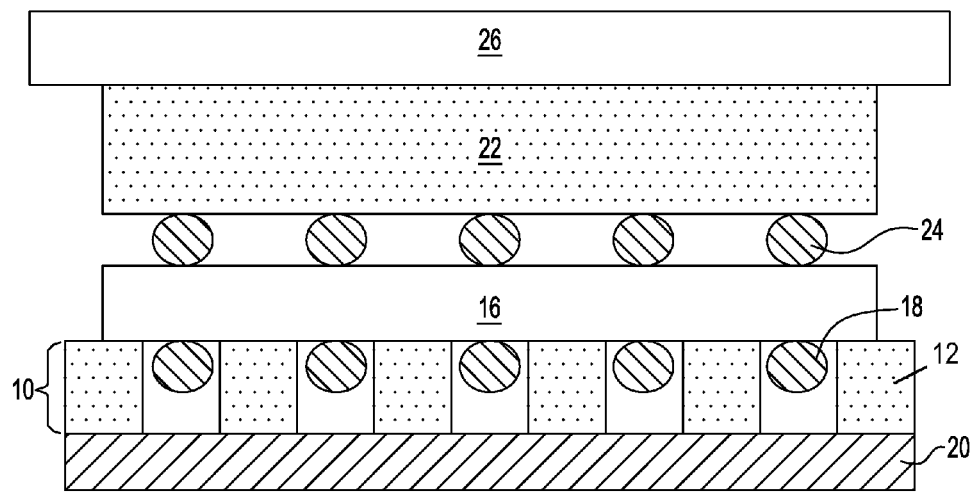
FIG. 5 is a cross sectional view of the structure illustrated in FIG. 4 after applying a weighted force to a surface of the semiconductor chip which is opposite the surface of the semiconductor chip containing the second set of solder balls.

Referring now to FIG. 5, there is illustrated the structure of FIG. 4 after applying a weighted force to a surface of the semiconductor chip 22 which is opposite the surface of the semiconductor chip 22 containing the second set of solder balls 26. In some embodiments, the weighted force can be applied during the tacking stage of the present application. The weighted force may be applied by a material layer, a vice clamp, a framing element or another vacuum source which exerts a downward force on the structure shown in FIG. 5. In drawing, the weighted force is supplied by a material layer 26 that is positioned on an exposed surface of semiconductor chip 22.

In some embodiments, the weighted force may be applied by hand or by mechanical means. In other embodiments, a vacuum positioned above the semiconductor chip 22 can be used to align and place the weighted force to the structure shown in FIG. 4.

In one embodiment of the present application, the weighted force that is applied has a weight from 50 grams to 200 grams. In another embodiment, the weighted force that is applied has a weighted force from 5 grams to 50 grams.

Figure 6:
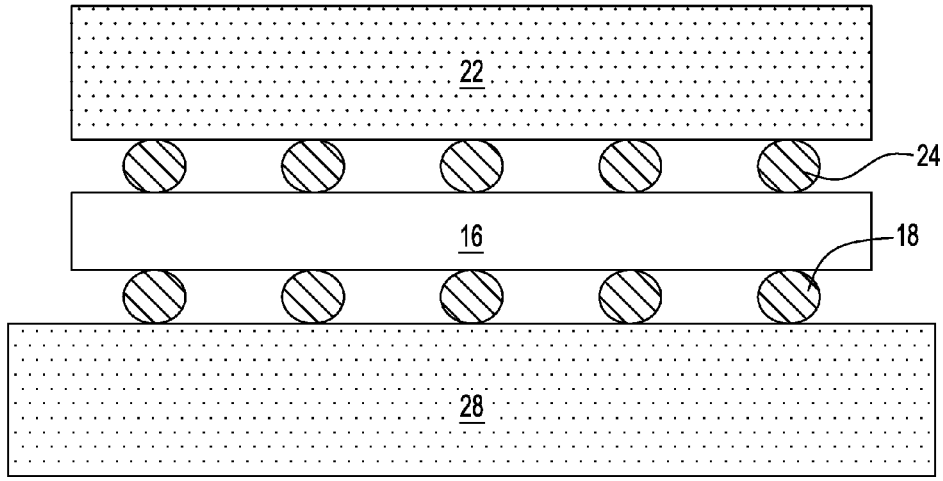
FIG. 6 is a cross sectional view of the structure illustrated in FIG. 5 after contacting a second assembly of the interposer structure and the semiconductor chip to a substrate and performing a furnace solder reflow process.

Referring to FIG. 6, there is illustrated the structure of FIG. 5 after contacting a second assembly of the interposer structure 15 and the semiconductor chip 22 to a substrate 28 and performing a furnace reflow process. The furnace reflow process serves to reflow the first and second solder balls and join each set of solder balls to their respective metal bond pads by forming an intermetallic bond.

In one embodiment of the present application, substrate 28 that can be used is a laminated polymeric structure with metal vias and lines present therein. In another embodiment, substrate 28 is a flexible substrate. In another embodiment, the substrate 28 is a ceramic, a glass ceramic or composite with metal vias and lines present therein. In yet another embodiment, substrate 28 may include a packaging substrate. In further embodiment, substrate 28 may include yet another semiconductor chip. Substrate 28 contains metal bond pads located on the surface that is to be joined to the respective first set of solder balls 18 (or solder interconnect containing metal pillars or post structures) of the interposer structure 15.

In some embodiments, and prior to contacting the second assembly of the interposer structure 15 and the semiconductor chip 22 to substrate 28, a solder flux can be applied to the surface of the substrate 28 that is to be brought into contact with the second assembly. The solder flux is a chemical that removes surface oxides from metallic surfaces to facilitate subsequent solder bonding.

The contacting of the second assembly of the interposer structure 15 and the semiconductor chip 22 to substrate 28 includes first removing the second assembly from the vacuum source 20. The removing the second assembly from the vacuum source 20 may comprise turning off the vacuum source 20. After the vacuum source 20 has been removed, the second assembly is removed from the vacuum distribution plate 10. The removing of the second assembly from the vacuum distribution plate 10 may be performed by hand or by a mechanical means such as, for example, a robot arm.

In some embodiments of the present application, the weighted force may remain on the second assembly during both of the above removal processing steps. Alternatively and in other embodiments of the present application, the weighted force may be removed from the second assembly either after removing the second assembly from the vacuum source 20, or after removing the second assembly from the vacuum distribution plate 10.

Once the second assembly is removed from both the vacuum source 20 and the vacuum distribution plate 10, the second assembly is brought into contact with a surface of substrate 28. Notably, the first set of solder balls 18 (or solder interconnect containing metal pillars or post structures) of the interposer structure 15 are brought into contact with the respective surface metal bond pads of substrate 28. The step of the present application can be performed by hand or by a mechanical means such as, for example, a robot arm. The substrate 28 may be positioned on a substrate holder or once contact is made the structure including the second assembly and the substrate 28 may be positioned on a substrate holder.

Next, a furnace reflow process (i.e., reflow solder joining technique or just simply a solder reflow) is applied to the second assembly which forms an intermetallic bond between the first set of solder balls 18 (or solder interconnect containing metal pillars or post structures) and the substrate 28 and the second set of solder balls 24 (or solder interconnect containing metal pillars or post structures) and the interposer component 16 of interposer structure 15. Notably, the intermetallic bonding occurs between the first set of solder balls 18 (or solder interconnect containing metal pillars or post structures) and the metal bond pads that are positioned on substrate 28, and between the second set of solder balls 24 (or solder interconnect containing metal pillars or post structures) and the metal bond pads that are positioned on the interposer component 16 of interposer structure 15. The furnace reflow process may be performed in a reflow oven utilizing any heat source including, for example, infrared heating elements.

Generally, a temperature above the reflow temperature of the solder bumps is used to ensure complete reflow of the solder. In one embodiment of the present application, the furnace reflow process is performed at a temperature from 218° C. to 260° C. In another embodiment of the present application, the furnace reflow process is performed at a temperature from 240° C. to 260° C. The reflow solder anneal may be performed in an inert ambient including, for example, one of helium, argon and neon. In another ambient, the reflow solder anneal may be performed in an atmosphere of nitrogen.

Figure 7:
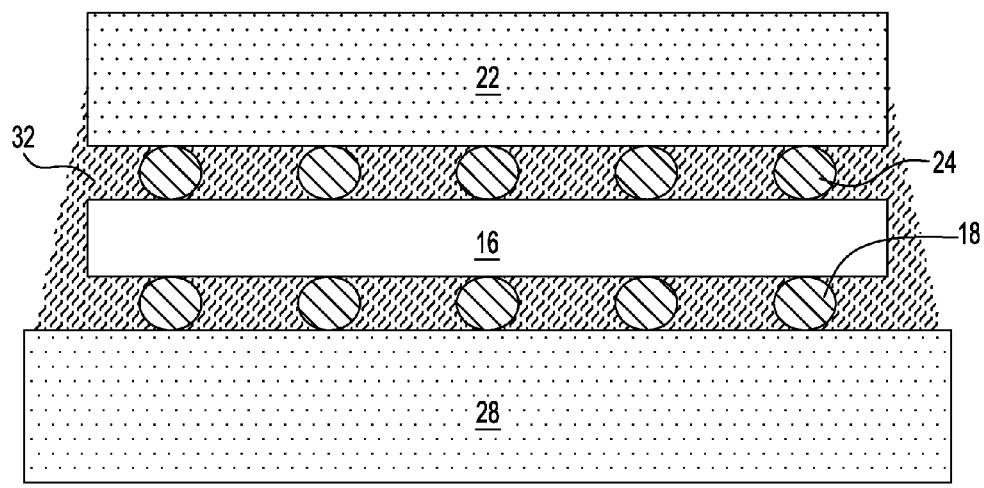
FIG. 7 is a cross sectional view of the structure illustrated in FIG. 6 after performing an underfill process.

Referring to FIG. 7, there is illustrated the structure of FIG. 6 after performing an underfill process. The underfill process provides an underfill material 32 to the 3D assembly. The underfill material 32 is formed between the joined first and second set of solder balls 18 (or solder interconnect containing metal pillars or post structures) and 24 and between the semiconductor chip 22 and the substrate 28. As such, sidewalls of interposer component 16 of the interposer structure 15 are also covered with the underfill material 32.

The underfill material 32 that can be used in the present application can include any well known epoxy filled material. In one example, underfill material 32 may comprise a silicon dioxide or silicon nitride particulate filler. The underfill process that can be used to provide underfill material 32 to the 3D assembly shown in FIG. 6 includes any of the well known techniques for providing such a material to a bonded assembly. Such techniques may include application of an underfill material precursor and curing.

Figure 8:
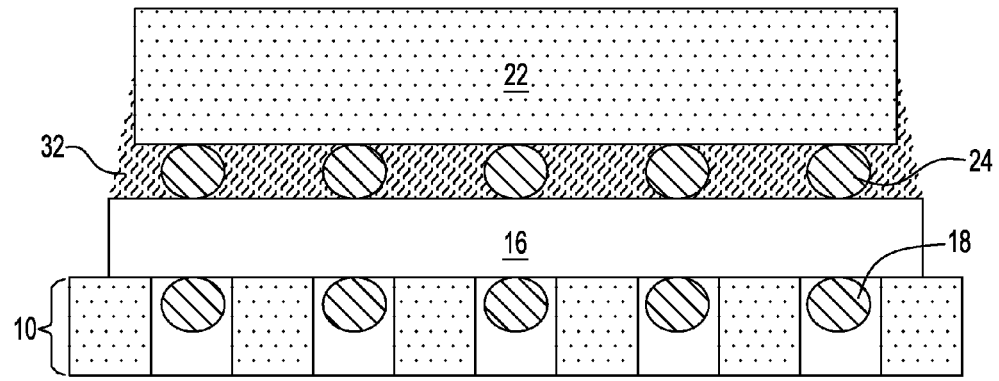
FIG. 8 is a cross sectional view of the structure illustrated in FIG. 5 after performing a first underfill process and removing the weighted force to the semiconductor chip of the second assembly in accordance with a second exemplary embodiment of the present application.

Referring now to FIG. 8, there is illustrated the structure of FIG. 5 after performing a first underfill process and removing the weighted force to the semiconductor chip 22 of the second assembly in accordance with a second exemplary embodiment of the present application. In this embodiment of the present application, the semiconductor chip 22 is shown to be shorter in length than that of the interposer structure 15. Moreover, and in this embodiment, the first underfill process provides a first underfill material 32 to the second assembly of the interposer structure 15 and the semiconductor chip 22. Notably, the first underfill material 32 is formed in an area between the surface of interposer component 16 and the semiconductor chip 22 and surrounding each second set of solder balls 24 (or solder interconnect containing metal pillars or post structures). The first underfill material 32 that can be used in this embodiment of the present application may include any well known epoxy filled material. In one example, the first underfill material 32 may comprise a silicon dioxide or silicon nitride particulate filler. The underfill process that can be used to provide first underfill material 32 to the second assembly includes any of the well known techniques for providing such a material to a bonded assembly.

After forming the first underfill material 32, the weighted force can be removed providing the structure shown, for example, in FIG. 8. The weighted force can be removed utilizing any of the techniques mentioned above in removing the weighted force from the structure of FIG. 6.

Figure 9:
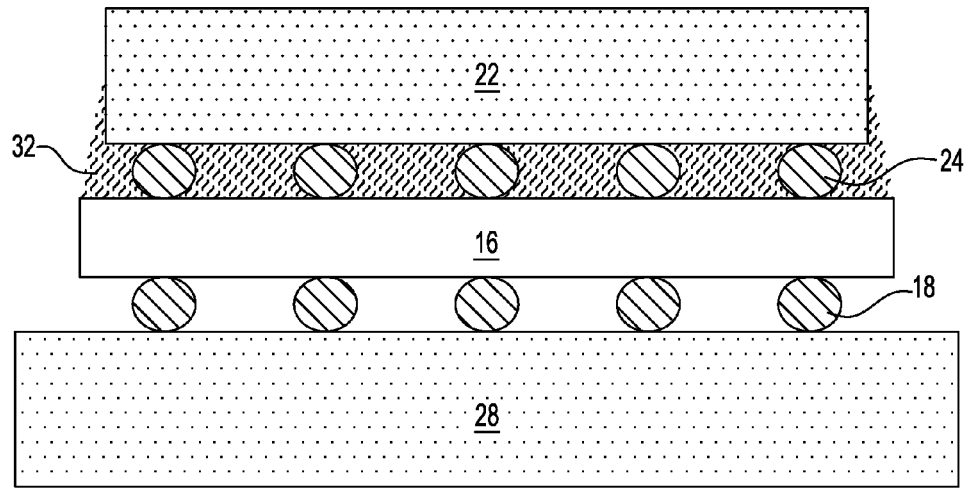
FIG. 9 is a cross sectional view of the structure illustrated in FIG. 8 after contacting a second assembly of the interposer structure and the semiconductor chip to a substrate and performing a furnace solder reflow process.

Referring now to FIG. 9, there is illustrated the structure of FIG. 8 after contacting a second assembly of the interposer structure 15 and the semiconductor chip 22 to a substrate 28 and performing a furnace reflow joining process. The processing steps used in providing the structure shown in FIG. 6 of the present application can also be used herein for providing the structure shown in FIG. 9.

In some embodiments, and prior to contacting the second assembly of the interposer structure 15 and the semiconductor chip 22 to substrate 28, a solder flux can be applied to the surface of the substrate 28 that is to be brought into contact with the second assembly. The solder flux is a chemical that removes surface oxides from metallic surfaces to facilitate subsequent solder bonding.

Figure 10:
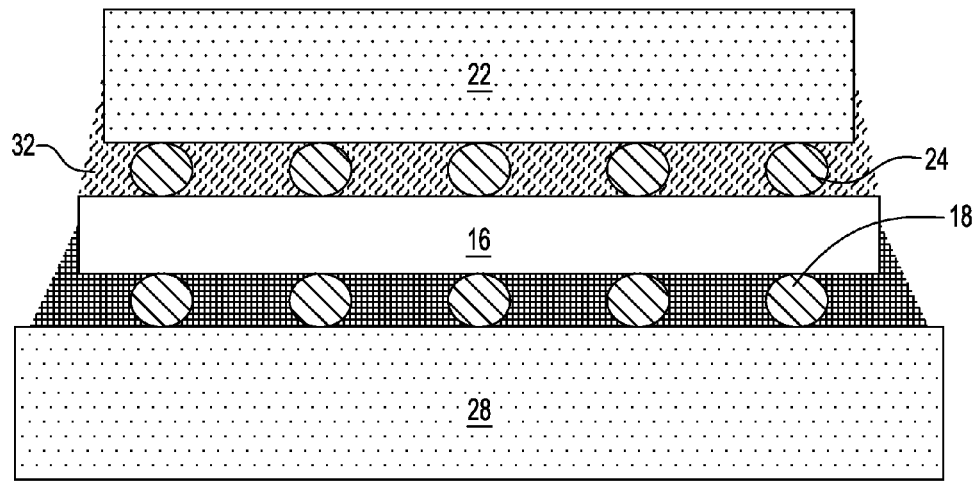
FIG. 10 is a cross sectional view of the structure illustrated in FIG. 9 after performing a second underfill process in accordance with an embodiment of the present application.

Referring now to FIG. 10, there is illustrated the structure of FIG. 9 after performing a second underfill process in accordance with an embodiment of the present application. The second underfill process provides a second underfill material 34 to 3D assembly. Notably, the second underfill material 34 is formed in an area between the surface of interposer component 16 and the substrate 28 and surrounding each first set of solder balls 18 (or solder interconnect containing metal pillars or post structures). The second underfill material 34 can also be present on portions of vertical edges of component 16 of the interposer structure 15.

The second underfill material 34 that can be used in this embodiment of the present application may include a same underfill material as the first underfill material 32. Alternatively, the second underfill material 34 that can be used in this embodiment of the present application may include a different underfill material as the first underfill material 32. The underfill process that can be used to provide first underfill material 34 to the 3D assembly includes any of the well known techniques for providing such a material to a bonded assembly.

Figure 11:
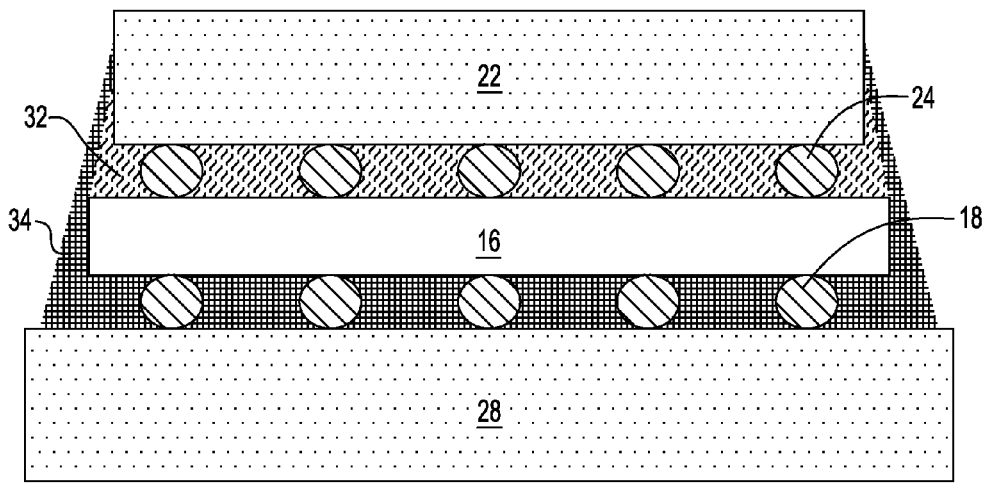
FIG. 11 is a cross sectional view of the structure illustrated in FIG. 9 after performing a second underfill process in accordance with another embodiment of the present application.

Referring now to FIG. 11, there is illustrated the structure of FIG. 9 after performing a second underfill process in accordance with another embodiment of the present application. The second underfill process provides a second underfill material 34 to 3D assembly. Notably, the second underfill material 34 is formed in an area between the surface of interposer component 16 and the substrate 28 and surrounding each first set of solder balls 18 (or solder interconnect containing metal pillars or post structures). The second underfill material 34 can also be present on vertical edges of component 16 of the interposer structure 15, contact outermost edges of first underfill material 32 and contact portions of vertical edges of semiconductor chip 22.

The second underfill material 34 that can be used in this embodiment of the present application may include a same underfill material as the first underfill material 32. In such an instance, the first and underfill materials would provide a contiguous underfill material that lacks any interfaces. Alternatively, the second underfill material 34 that can be used in this embodiment of the present application may include a different underfill material as the first underfill material 32. In such an instance, the first and second underfill materials are not of unitary construction and an interface would be present between the two different underfill materials. The underfill process that can be used to provide first underfill material 34 to the 3D assembly includes any of the well known techniques for providing such a material to a bonded assembly.

The above described and illustrated methods provide a 3D vertically stacked assembly comprising, from bottom to top, substrate 28, interposer component 16, and semiconductor chip 22. Warping of the 3D vertical stacking assembly that is provided by the present application is mitigated since the above described methods utilizing vacuum distribution plate 10 during the bonding process.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A bonding method comprising:
    inserting an interposer structure into a vacuum distribution plate, wherein said vacuum distribution plate has a planar contact surface;
    applying a vacuum to a first assembly of said interposer structure and said vacuum distribution plate, wherein said vacuum applies a force to said interposer structure so that said interposer structure is conformed to said planar contact surface of said vacuum distribution plate, wherein conforming said interposer structure to said planar contact surface of said vacuum distribution plate removes a curvature from said interposer structure;
    tacking a semiconductor chip to a surface of said interposer structure that is opposite a surface of said interposer structure that is in contact with said planar contact surface of said vacuum distribution plate;
    contacting a second assembly of said interposer structure and said semiconductor chip to a substrate; and
    applying a furnace reflow process to said second assembly to bond said second assembly to said substrate.

2. The bonding method of claim 1, wherein said interposer structure includes a first set of solder balls and said semiconductor chip includes a second set of solder balls.

3. The bonding method of claim 2, wherein said interposer structure comprises a semiconductor base material and interconnect circuitry.

4. The bonding method of claim 3, wherein said interposer structure comprises logic devices, memory devices, devices for voltage regulation, or a combination thereof.

5. The bonding method of claim 2, wherein said vacuum distribution plate has a series of openings separated by a distance corresponding to a distance separating adjacent solder balls in said first set of solder balls.

6. The bonding method of claim 1, wherein said vacuum distribution plate comprises a material having first coefficient of thermal expansion and said interposer structure comprises an interposer component having a second coefficient of thermal expansion, wherein said first coefficient of thermal expansion substantially equals the second coefficient of thermal expansion.

7. The bonding method of claim 6, wherein said vacuum distribution plate is composed of a semiconductor or dielectric material having openings formed by pattern and etch processing.

8. The bonding method of claim 5, wherein said inserting said interposer structure into said vacuum distribution plate comprises positioning said first set of solder balls within said series of openings that are present in said vacuum distribution plate.

9. The bonding method of claim 5, wherein said applying said vacuum to said first assembly of said interposer structure and said vacuum distribution plate comprises pulling said vacuum through said openings in said vacuum distribution plate, wherein said gauge pressure may range from −60 kPa to −90 kPa.

10. The bonding method of claim 5, wherein said curvature of said interposer structure ranges from 500 µm to 1.5 mm, wherein a thickness for said interposer structure ranges from 30 µm to 50 µm.

11. The bonding method of claim 5, wherein said vacuum is maintained during said tacking of said semiconductor chip to said surface of said interposer structure that is opposite said surface of said interposer structure that is in contact with said planar contact surface of said vacuum distribution plate.

12. The bonding method of claim 1, wherein after tacking said semiconductor chip to said surface of said interposer structure, said interposer structure is substantially planar.

13. The bonding method of claim 5, wherein said tacking of said semiconductor chip comprises applying a pressure to said second assembly of said interposer structure and said semiconductor chip, and thermal annealing said second assembly of said interposer structure and said semiconductor chip to provide a diffusion bonded connection between said second set of solder balls of said semiconductor chip and metal bond pads of said interposer structure.

14. The bonding method of claim 13, wherein said thermal annealing is performed at a temperature ranging from 200° C. to 215° C.

15. The bonding method of claim 5, wherein said furnace reflow process is performed at a temperature ranging from 218° C. to 260° C.

16. The bonding method of claim 1, further comprising applying a weighted force to said surface of said semiconductor chip opposite a surface of said semiconductor chip that said second set of solder balls are present on between said tacking and said contacting steps.

17. The bonding method of claim 1, wherein said furnace reflow process that is applied to said second assembly forms an intermetallic bond between said first set of solder balls and said substrate.

18. The bonding method of claim 1, wherein said substrate is a laminated polymeric structure with metal vias and lines present therein.

19. The bonding method of claim 5, further comprising an underfill process applied to said second assembly that is bonded to said substrate.

* * * * *